United States Patent [19]

Oldenettel

[11] Patent Number: 4,791,248

[45] Date of Patent: Dec. 13, 1988

[54] PRINTED WIRE CIRCUIT BOARD AND ITS METHOD OF MANUFACTURE

[75] Inventor: Jayne L. Oldenettel, Kent, Wash.

[73] Assignee: The Boeing Company, Seattle, Wash.

[21] Appl. No.: 6,823

[22] Filed: Jan. 22, 1987

[51] Int. Cl.⁴ ............................................. H05K 1/00
[52] U.S. Cl. ..................................... 174/68.5; 427/97
[58] Field of Search ............................ 174/685; 427/97

[56] References Cited

U.S. PATENT DOCUMENTS

| | | | |
|---|---|---|---|
| 3,294,576 | 12/1966 | Geraghty | 174/68.5 |
| 3,296,099 | 1/1967 | Dinella | 174/68.5 |
| 3,334,395 | 8/1967 | Cook et al. | 174/68.5 |
| 3,436,819 | 4/1969 | Lunine | 29/530 |
| 3,508,330 | 4/1970 | Kijbik | 29/530 |
| 3,573,707 | 4/1971 | Reynolds | 174/68.5 X |
| 3,745,095 | 7/1973 | Chadwick et al. | 427/97 X |
| 3,873,756 | 3/1975 | Gall et al. | 174/68.5 |
| 3,886,022 | 5/1975 | Konicek | 156/344 |
| 3,932,932 | 1/1976 | Goodman | 174/68.5 X |
| 3,934,334 | 1/1976 | Hanni | 174/68.5 X |
| 4,303,715 | 12/1981 | Chang | 427/97 |
| 4,390,489 | 6/1983 | Segal | 264/126 |
| 4,445,952 | 5/1984 | Reynolds, III et al. | 174/68.5 X |
| 4,452,664 | 6/1984 | Grey, Jr. et al. | 156/631 |
| 4,478,884 | 10/1984 | Barnes et al. | 427/97 |

FOREIGN PATENT DOCUMENTS 1105068   3/1968   United Kingdom .............. 174/68.5

OTHER PUBLICATIONS

McDermott, C. J.; Face Protection of Printed Circuit Boards; IBM Technical Disclosure Bulletin; vol. 11 No. 7; Dec. 1968; p. 733.

Primary Examiner—Morris H. Nimmo

[57] ABSTRACT

Thermal shock tolerance is achieved in conductive core printed wire circuit boards, especially those having graphite or copper-Invar-copper cores for heat removal and expansion control, by filling the oversized through-holes with glass-filled, m-diallyl phthalate resin and plating on the inner surface of a bore drilled through the resin. Meta-diallyl phthalate has a coefficient of thermal expansion that is lower than epoxy and that is closer to that of the core. It creates a substantially void free, dielectric collar between the plating and the core to insulate the two electrically. Its use temperature is higher than epoxy while its curing temperature is lower than polyimide. The boards can be made by molding of the thermosetting resin in a peel ply process that avoids milling of the board and reduces waste.

14 Claims, 2 Drawing Sheets

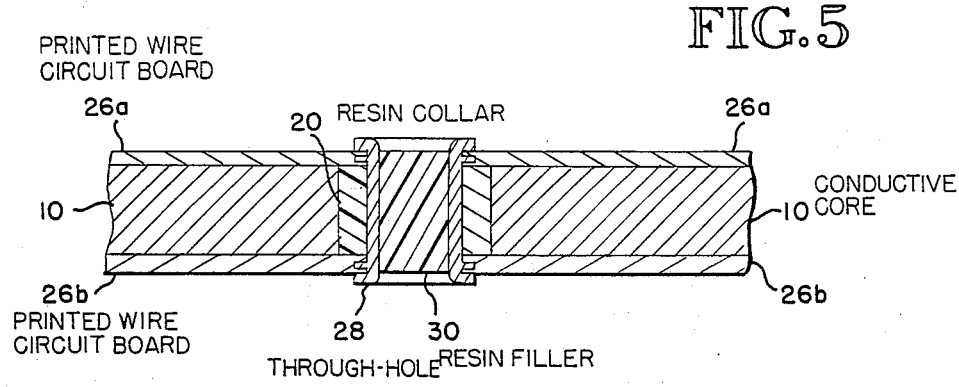

PRINTED WIRE CIRCUIT BOARD AND ITS METHOD OF MANUFACTURE

TECHNICAL FIELD

The present invention relates to conductive core printed wire circuit boards designed for controlled expansion using m-diallyl phthalate dielectric collar to improve the thermal shock tolerance of the boards. The boards are built to be compatible with high input/output (I/O) ceramic chip carriers.

BACKGROUND ART

Conductive cores in printed wire circuit boards remove heat as the circuit operates. Demand for controlled expansion of the boards has lead to cores being fabricated from "graphite" or copper-Invar-copper materials. These cores are constructed preciously to a predetermined thickness within close tolerances and cannot be milled. They are susceptible to damage if exposed to high temperatures, such as the temperatures required to cure polyimides.

For aluminum core printed wire circuit boards, epoxy/glass or polyimide/glass through-hole dielectric resins have been used with mixed results. The manufacturing system requires special caul plates to control flow of the resins during curing in a potting process. A large excess of composite filler is used, and the cores and filled holes must be milled to the final dimensions. This process cannot be used for other conductive core boards. The cured resin often includes voids which must be repaired or the core is rejected.

Epoxy/glass and polyimide/glass boards have a relatively low lifetime when subject to MIL-spec thermal shock cycle tests. Epoxy/glass boards generally fail to withstand more than about 100 cycles because of the relatively large mismatch between the coefficient of thermal expansion (CTE) of the core, of the cured composite, dielectric collar, and of the metal (copper through-hole. Often failure will occur when the epoxy resin pulls away from the copper, leaving an unsupported plated-through-hole.

These and other problems of the prior art, however, have been overcome for conductive core printed wire circuit boards by using m-diallyl phthalate as the resin, since it (1) has a lower coefficient of thermal expansion than epoxy (and one closer to that of the core), (2) has a higher use temperature than epoxy, (3) has a lower cure temperature than polyimide (and can be used with "graphite" cores that would be harmed by exposure to temperatures required to cure polyimides), (4) provides a substantially void free dielectric collar between the core and the contact plating in the through-hole, and (5) can be drilled after curing.

In its Technical Disclosure Bulletin, Vol. 11, No. 7 (December 1968), IBM describes a process for achieving face protection on printed circuit boards. A filler resin is pressed into a drilled and plated hole to reinforce the structure. Excess resin can be removed by a peel ply technique or by chemical dissolution (with milling as necessary). This IBM process uses unfilled epoxy resin (primarily) and is designed for filling the already plated holes. The filling does not form an insulative, dielectric collar between a conductive core and the plating, and does not provide a substantially void free composite surface on which metal can be plated.

SUMMARY OF THE INVENTION

Superior conductive core printed wire circuit boards are prepared by injection molding glass-filled m-diallyl phthalate into oversized through-holes in the core, curing the resin, removing excess cured resin from atop the core with a peel ply, drilling the cured resin to provide a bore of predetermined diameter through the core, and plating on the exposed inner surface of the bore to connect the two sides of the board electrically.

Meta-diallyl phthalate is the preferred resin for the filler because it is a thermosetting, injection moldable resin that flows well even when filled with fiberglass to form a substantially void free composite that fills all apertures on the board. The resin has a use temperature higher than epoxy and a curing temperature lower than polyimide. It can be used with aluminium, "graphite," and copper-Invar-copper cores. It has a coefficient of thermal expansion lower than epoxy. Once cured, the composite can be drilled to provide a surface on which a conductive plating can be readily applied by techniques comparable to those used for epoxy.

While the preferred resin is formulated to be injection molded, the manufacturing process that is used is preferably a modified lamination press cycle, as will be explained.

Circuit boards made with m-diallyl phthalate dielectric collars are readily able to withstand in excess of 500 thermal shock cycles without failure and have been tested to survive more than 1000 cycles, according to the tests of MIL-spec MIL-P-55110C.

The boards are prepared by drilling oversized holes in the core, positioning the core atop a separater sheet on tooling pins of an injection molding caul plate, overlaying a 5-mil aluminum foil on the core (the foil having holes of smaller diameter corresponding to and registering with the holes in the core), applying a layer of resin powder over the foil, applying a second separator sheet and the top caul plate, compressing the resin to fill the through-holes, curing the resin at elevated temperatures and pressures, disassembling the caul plates, peeling off the foil, laminated printed wire boards (RWBs) over the filled core, drilling a bore through the PWBs and cured resin composite to leave a plating surface for the plated contact between the two sides of the board, and plating the bore to form a plated-through-hole.

These and other features of the present invention will be more clearly understood with reference to the accompanying detailed description, drawings, and claims.

BRIEF DESCRIPTION OF THE DRAWINGS

FIG. 5 a schematic elevation of the board of FIG. 4, showing a plated-through-hole having the dielectric collar of the present invention between the core and the plated-through-hole.

BEST MODE CONTEMPLATED FOR CARRYING OUT THE INVENTION

Thermal shock tolerance is achieved in conductive core printed wire circuit boards by filling the oversized through-holes in the core with Plaskon FS-10, a m-diallyl phthalate/glass fiber composite and by plating on the substantially void free inner surface of the composite with standard PC plating techniques designed to connect the two sides of the board electrically. For "graphite" (i.e., for purposes of this description and as understood in the prior art, an epoxy/graphite matrix) cores or copper-Invar-copper cores, the composite allows filling without milling, thereby permitting these cores to be precisely fabricated prior to filling. The prefabrication allows optimum heat removal and expansion control. The boards can easily withstand in excess of 500 thermal shock cycles and have been tested to withstand more than 1000 cycles. Thermal shock tolerance is achieved principally by reducing the coefficient of thermal expansion (CTE) mismatch between the core and the filler. Meta-diallyl phthalate was a lower CTE than epoxy and is closer to the CTE of the core or to the plated-through-hole.

Plaskon FS-10 (a trademark of Plaskon) cures at temperatures comparable to those for epoxies, but produces a composite having a glass transition temperature of over 200° C., (more than 50° C. higher than that of epoxy). Plaskon FS-10 also cures at a lower temperature and pressure than polyimide, thereby allowing its use with "graphite" cores.

A fronting mask of 5-mil aluminum foil can be used on one face of the core during the molding step of manufacture, and can be used to peel away the excess resin following curing, leaving a filled through-hole and rough surface at the break, which can be milled smooth or merely drilled out to create the plating surface on the collar's bore through cured composite.

Plaskon FS-10 has a dielectric constant comparable to epoxy and provides an adequate insulation between the core and conductive through-hole plating. The cured composite is substantially free of voids and its an excellent surface for plating.

Figure 1:
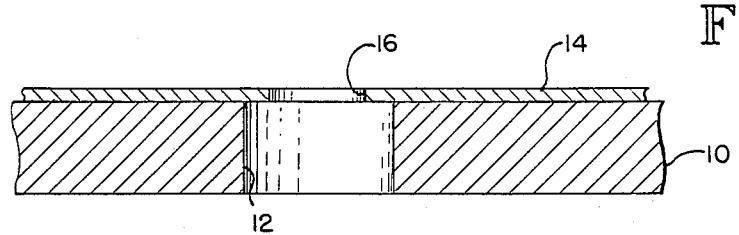
FIG. 1 is a schematic elevation showing a core and foil overlay ready for filling.
Figure 2:
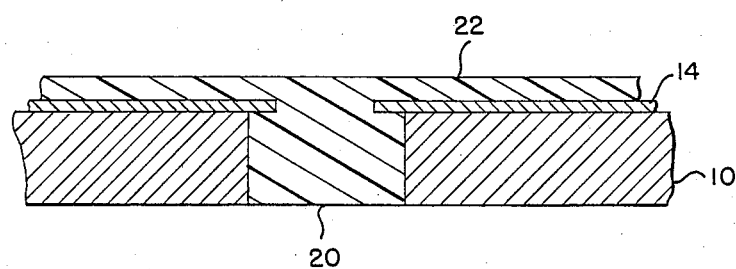
FIG. 2 is another schematic elevation, similar to FIG. 1, showing the filled through-hole filled in the core.
Figure 3:
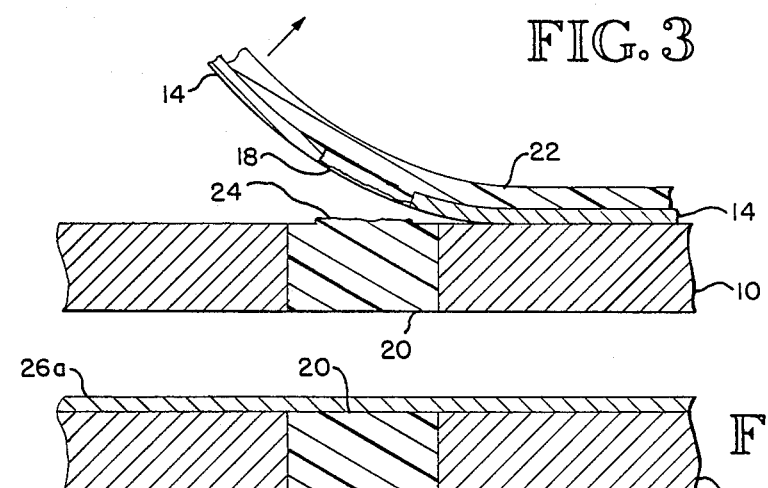
FIG. 3 is a schematic elevation, similar to FIGS. 1 and 2, showing peeling off of the foil and excess resin composite following curing.
Figure 4:
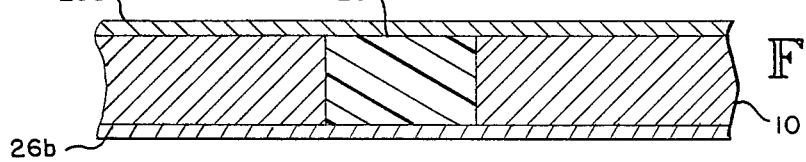
FIG. 4 is a schematic elevation of the core of FIG. 3 having printed wire circuit boards laminated to the upper and lower surface.

Referring briefly now to the drawings, a conductive core 10 has an oversized through-hole 12. A foil sheet 14 overlies the core 10 and has a smaller diameter hole 16 in registration with the through-hole 12. The hole 16 ensures a smooth transition from the core 10 to the dielectric collar 20 when fabrication is complete. The diameter of the hole 16 should be small enough that the neck of composite 18 (FIG. 3) can be easily broken when the foil sheet 14 is peeled away from the core 10.

The resin for the collar 20 in powder form is spread over the sheet 14 and is compressed and into the hole with a caul plate to completely fill the through-hole 12 and to create a thin film 22 of excess resin on the sheet 14. The term "resin," for purposes of this process description, is intended to mean both the commercially—available m-diallyl phthalate and glass fiber filling in the preferred embodiment of the invention.

Following curing of the resin at elevated temperatures and pressures to form a plug, the excess resin 22 and foil sheet 14 are peeled away from the core 10 to leave a filled through-hole with a rough central portion 24 at the break of the neck. This portion can be milled, or, preferably, can simply be machined away, after laminated the core 10 with upper and lower printed wired circuit boards 26a and 26b, by drilling through the boards 26a and 26b and plug to form a bore that extends from one side of the laminated board to the other. The substantially void-free surface of the bore can be cleaned and a conductive plating (of copper, preferably) can be adhered to the surface to form a plated-through-hole 28. As shown in FIG. 5, the filled resin collar 20, accordingly, forms a dielectric collar insulating and electrically isolating the core 10 from the plated-through-hole 8. If desired, the bore can be filled with resin 30 (as in the IBM technique) to provide additional structural integrity for the board.

While Plaskon FS-10 is a preferred resin composite for the dielectric collar 20, other resins that have the same combination of physical properties can also be used.

The following table shows the typical results observed during comparative thermal shock testing of graphite core boards of the present invention and epoxy-filled boards of the prior art.

TABLE 1

Thermal Shock Cycle Testing (based upon four C4) board and sample size)
165 MIL - 12 Layer - CTE 8 ppm/°C.
Thermal Shock Cycle - −55 to +125° C.

| Resin | Aspect Ratio | Minimum Cycles[1] to Failure | Minimum Cycles[1] to Failure |
|---|---|---|---|
| Epoxy | — | less than 50 | less than 150 |
| Plaskon | 4.7:1 | 560 | 835 |
| Plaskon | 3.2:1 | 608 | more than 915 |
| Plaskon | 2.4:1 | more than 915 | more than 915 |

[1] based on first failure on the fourth board

The minimum cycles to failure have been confirmed from follow-on tests on board performance.

While a preferred embodiment has been shown and described, those skilled in the art will recognize variations, modifications, or alterations that can be made go the preferred embodiment without departing from the inventive concept. For example, other resins could be used. Accordingly, the description drawings, and claims should be interpreted liberally to protect the invention, and the invention should only be limited as is necessary in view of the pertinent prior art.

I claim:

1. A conductive core printed wire circuit board, comprising:
   (a) a printed wire circuit board having a conductive core and at least one oversized through-hole extending through the core;
   (b) a dielectric collar in the through-hole, the collar being a cured filled resin substantially free of voids, having a coefficient of thermal expansion closer to that of the core than the coefficient of thermal expansion of epoxy, and having a central bore drilled into the collar and
   (c) a conductive plating on the inner surface of the bore forming a plated-through-hole, the plating providing electrical connection between one side of the board and the other side but being electrically insulated from the core by the collar.

2. A conductive core printed wire circuit board, comprising:
   (a) a printed wire circuit board having a conductive core and at least one oversized tnrough-hole extending through the core;
   (b) a dielectric collar in the through-hole, the collar being a cured, filled resin substantially free of voids, having a coefficient of thermal expansion closer to that of the core than the coefficient of thermal expansion of epoxy, and having a central bore drilled into the collar wherein the resin is m-diallyl phthalate; and (c) a conductive plating on the inner surface of the bore forming a plated-through-hole, the plating providing electrical connection between one side of the board and the other side but being electrically insulated from the core by the collar.

3. The board of claim 2 wherein the core is selected from the group consisting of aluminum, graphite, or copper-Invar-copper.

4. The board of claim 2 wherein the resin is filled with fiberglass.

5. The board of claim 2 wherein the resin has a use temperature higher than epoxy and a curing temperature lower than polyimide.

6. The board of claim 5 wherein the resin has a glass transition temperature of above about 200° C.

7. The board of claim 2 wherein the plated-through-hole is copper.

8. The board of claim 2 wherein the resin is injection moldable and thermosetting.

9. A conductive core printed wire circuit board, comprising:
 (a) a printed wire circuit board having a conductive core to remove heat and to control expansion, the core being selected from the group consisting of aluminum, graphite, or copper-Invar-copper, and having at least one oversized through-hole extending through the core from one side of the board to the otherside;
 (b) a dielectric collar adhered to the surface of the through-hole, the collar being a resin composite including fiberglass reinforcement, the resin having a use temperature higher than epoxy and curing temperature lower than polyimide, the resin also having a glass transition temperature in excess of about 200° C. and a coefficient of thermal expansion lower than epoxy/glass and polyimide/glass, the filler having a central bore and being substantially free of voids; and
 (c) a conductive plating forming a plated-through-hole on the inner surface of the bore, the plating providing electrical connection between one side of the board to the other side but being electrically insulated from the core of the board by the filler.

10. The board of claim 9 wherein the resin includes diallyl phthalate.

11. The board of claim 10 wherein the core is graphite.

12. The board of claim 10 wherein the core is copper-Invar-copper.

13. A printed wire circuit board having a conductive core, a m-diallyl phthalate dielectric collar through the core, and a plated-through-hole on the inner surface of the collar, the collar insulating the plated-through-hole from the core.

14. A conductive core printed wire circuit board, comprising:
 (a) a conductive core;
 (b) a dielectric layer having a first surface in contact with at least a portion of the conductive core; and
 (c) a conductive plating on a second surface of the dielectric layer and being electrically isolated from the conductive core.
wherein the dielectric layer is m-diallyl phthalate so that the layer and core have a smaller mismatch in coefficients of thermal expansion than the core would have with epoxy.

* * * * *